(12) United States Patent
Kwak et al.

(10) Patent No.: US 12,069,804 B2
(45) Date of Patent: Aug. 20, 2024

(54) ELECTRONIC DEVICE COMPRISING PRINTED CIRCUIT BOARD ASSEMBLY

(71) Applicant: Samsung Electronics Co., Ltd., Gyeonggi-do (KR)

(72) Inventors: Kyujin Kwak, Gyeonggi-do (KR); Jinwoo Park, Gyeonggi-do (KR); Yonglak Cho, Gyeonggi-do (KR); Jiwoo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 191 days.

(21) Appl. No.: 17/560,689

(22) Filed: Dec. 23, 2021

(65) Prior Publication Data

US 2022/0117086 A1    Apr. 14, 2022

Related U.S. Application Data

(63) Continuation of application No. PCT/KR2020/008505, filed on Jun. 30, 2020.

(30) Foreign Application Priority Data

Jul. 22, 2019    (KR) .................. 10-2019-0088178

(51) Int. Cl.
*H05K 1/02*    (2006.01)
*H05K 1/11*    (2006.01)

(52) U.S. Cl.
CPC .......... *H05K 1/115* (2013.01); *H05K 1/0218* (2013.01); *H05K 1/0243* (2013.01)

(58) Field of Classification Search
CPC .... H05K 1/115; H05K 1/0218; H05K 1/0243; H05K 1/144; H05K 1/181; H05K 1/141;
(Continued)

(56) References Cited

U.S. PATENT DOCUMENTS 5,473,510 A * 12/1995 Dozier, II ........... H01L 23/4006
439/91
5,703,753 A * 12/1997 Mok ..................... H01L 23/552
174/16.3

(Continued)

FOREIGN PATENT DOCUMENTS

JP    10-326980 A    12/1998
JP    2005-209729 A    8/2005
(Continued)

OTHER PUBLICATIONS

European Search Report dated Mar. 15, 2023.
Korean office Action dated Feb. 23, 2024.

*Primary Examiner* — Roshn K Varghese
(74) *Attorney, Agent, or Firm* — Cha & Reiter, LLC

(57) ABSTRACT

According to certain embodiments, an electronic device comprises: a housing including a first support member; a cover member coupled with and facing the first support member; a second support member coupled with and facing the first support member; a printed circuit board assembly disposed to face the first support member, the printed circuit board assembly having a part disposed between the first support member and the cover member and another part disposed between the first support member and the second support member; wherein the printed circuit board assembly comprises: a first circuit board including a first part disposed between the first support member and the cover member, and a second part disposed between the first support member and the second support member; a second circuit board disposed to at least partially face the first part and disposed between the first circuit board and the cover member; and an interposer board disposed to correspond to at least a part of an edge of the second circuit board and coupling the second circuit board with the first circuit board, and wherein the
(Continued)

second support member biases a part of the edge of the second circuit board.

19 Claims, 12 Drawing Sheets

(58) Field of Classification Search
CPC ....... H05K 2201/10378; H05K 5/0017; H05K 5/00; H05K 5/03; H05K 7/1061; H05K 1/14; H05K 1/145; H05K 9/0022; H05K 9/0024

See application file for complete search history.

(56) References Cited

U.S. PATENT DOCUMENTS

| 8,934,261 | B2* | 1/2015 | Lin | H01R 13/111 |
|---|---|---|---|---|
| | | | | 361/752 |
| 2009/0052149 | A1 | 2/2009 | Tanaka | |
| 2014/0071634 | A1 | 3/2014 | Pakula et al. | |
| 2014/0160691 | A1 | 6/2014 | Sohn et al. | |
| 2014/0239488 | A1 | 8/2014 | Kobayashi et al. | |
| 2018/0014426 | A1 | 1/2018 | Kim | |
| 2019/0051577 | A1 | 2/2019 | Morinaga et al. | |
| 2019/0082536 | A1 | 3/2019 | Park et al. | |
| 2020/0093040 | A1 | 3/2020 | Yun et al. | |
| 2020/0205289 | A1 | 6/2020 | Iida et al. | |
| 2020/0266562 | A1 | 8/2020 | Park et al. | |
| 2021/0014970 | A1 | 1/2021 | Ha et al. | |

FOREIGN PATENT DOCUMENTS

| JP | 2006-100306 A | 4/2006 |
|---|---|---|
| JP | 2008-177299 A | 7/2008 |
| JP | 2019-36678 A | 3/2019 |
| KR | 10-2012-0070290 A | 6/2012 |
| KR | 10-2014-0076102 A | 6/2014 |
| KR | 10-2018-0004972 A | 1/2018 |
| KR | 10-2019-0029215 A | 3/2019 |
| KR | 10-2020-0032911 A | 3/2020 |
| KR | 10-2020-0101018 A | 8/2020 |
| KR | 10-2021-0007217 A | 1/2021 |
| WO | 2019/069637 A1 | 11/2019 |

* cited by examiner

ELECTRONIC DEVICE COMPRISING PRINTED CIRCUIT BOARD ASSEMBLY

CROSS REFERENCE TO RELATED APPLICATIONS

This application is continuation of International Application No. PCT/KR2020/008505 filed on Jun. 30, 2020, which claims priority to Korean Patent Application No. 10-2019-0088178 filed on Jul. 22, 2019 in the Korean Intellectual Property Office, the disclosures of which are herein incorporated by reference.

1. FIELD

Certain embodiments of the disclosure relate to an electronic device, for example, to an electronic device including a printed circuit board assembly.

2. RELATED ART

A wide variety of functions are being integrated into single electronic devices. For example, a smart phone can also function as an audio player, an imaging device, or an electronic notebook, as well as a communication function, and other various functions. An electronic device may execute a loaded application or a stored file and receive various pieces of information in real time by accessing a server or another electronic device wirelessly or over a wired interface.

As the versatility of electronic device is increased, the performance or integration level of various electronic components is also increased. However, to keep the electronic device portable, there are restrictions on the size of the electronic device. Therefore, a printed circuit board may be miniaturized and a space for arranging other electronic components may be secured, by increasing the integration level of the arrangement of various electronic elements in the limited internal space of the electronic device.

SUMMARY

According to various embodiments of the disclosure, an electronic device comprises: a housing including a first support member; a cover member coupled with and facing the first support member; a second support member coupled with and facing the first support member; a printed circuit board assembly disposed to face the first support member, the printed circuit board assembly having a part disposed between the first support member and the cover member and another part disposed between the first support member and the second support member; wherein the printed circuit board assembly comprises: a first circuit board including a first part disposed between the first support member and the cover member, and a second part disposed between the first support member and the second support member; a second circuit board disposed to at least partially face the first part and disposed between the first circuit board and the cover member; and an interposer board disposed to correspond to at least a part of an edge of the second circuit board and coupling the second circuit board with the first circuit board, and wherein the second support member biases a part of the edge of the second circuit board.

According to certain embodiments, an electronic device comprises: a housing including a first support member; a first circuit board facing the first support member; a second circuit board facing the first support member, with a first part of the first circuit board therebetween; an interposer board corresponding to at least a part of an edge of the second circuit board and coupling the second circuit board with the first circuit board; a cover member coupled with the first support member to face the first support member, with the first part of the first circuit board or the second circuit board therebetween; and a second support member coupled with and facing the first support member, with a second part of the first circuit board therebetween, wherein the cover member biases a part of an edge of the second circuit board toward the first circuit board, and wherein the second support member is biases the first circuit board toward the first support member in the second part, and biases another part of the edge of the second circuit board toward the first circuit board.

BRIEF DESCRIPTION

DETAILED DESCRIPTION

Figure 1:
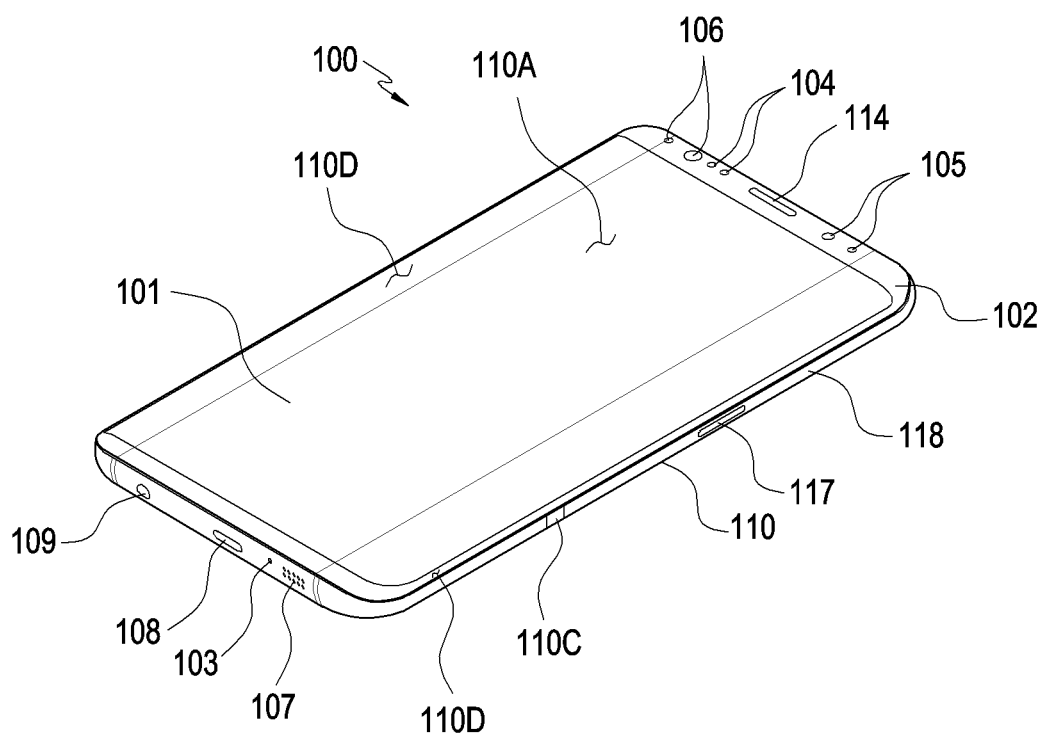
FIG. 1 is a perspective view illustrating the front surface of an electronic device according to certain embodiments.

An interposer board can be used to bond a plurality of printed circuit boards (PCB). This increases the integration level of electronic elements. For example, as a plurality of circuit boards are provided, a larger surface area may be secured, on which electric or electronic components, such as an integrated circuit chip, may be arranged. Although a thickness is increased to a certain extent by bonding the plurality of circuit boards to face each other, the surface area for arranging electric or electronic components thereon may further be increased. The foregoing may be useful for increasing the integration level. For example, as a PCB assembly in which a plurality of circuit boards are combined is used, the printed circuit board assembly may be miniaturized when the same electronic components are arranged, thereby securing a larger space for arranging other electronic components (e.g., a battery, a camera module, or a vibration module) therein in the electronic device.

However, when an impact occurs, a bonded part between an interposer board and another circuit board may be damaged. For example, a relative displacement may occur between two circuit boards bonded with an interposer board therebetween due to an impact or vibrations. This displacement may cause separation of the bonded part in the printed circuit board assembly. Even though the displacement does not separate the bonded part between the interposer board and the other circuit boards, it may cause cracks in the interposer board or bonded structures (e.g., a via conductor or a soldering pad) disposed on the other circuit boards.

Certain embodiments of the disclosure may provide an electronic device including a printed circuit board assembly, which may increase an integration level.

Certain embodiments of the disclosure may provide an electronic device which has an increased integration level to enable efficient use of an internal space.

Certain embodiments of the disclosure may provide an electronic device which may mitigate or prevent external impact-caused damage to a printed circuit board assembly.

In certain embodiments of the disclosure, the use of a printed circuit board assembly in which a plurality of (e.g., two) circuit boards are bonded to each other by means of an interposer board may lead to securing of a sufficient surface area for arranging electrical or electronic components therein, while reducing a space occupied by the printed circuit board assembly. For example, the internal space of an electronic device according to certain embodiments of the disclosure may be efficiently utilized, thereby increasing the integration level of the electronic device. According to certain embodiments, the electronic device may prevent generation of a relative displacement between circuit boards coupled with each other through an interposer board by fixing the circuit boards of the printed circuit board assembly using internal support member(s) and/or a cover member. For example, even when an impact is applied, damage to the internal structure of the printed circuit board assembly (e.g., the interposer board and the bonded part of the circuit boards coupled through the interposer board) may be mitigated or prevented, and the bonding state of the boards may be stably maintained.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in the disclosure, the term "module" may include a unit implemented in hardware, software, or firmware, and may interchangeably be used with other terms, for example, logic, logic block, part, circuitry, or the like. A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., a program) including one or more instructions that are stored in a storage medium (e.g., internal memory or external memory) that is readable by a machine (e.g., an electronic device). For example, a processor (e.g., a processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
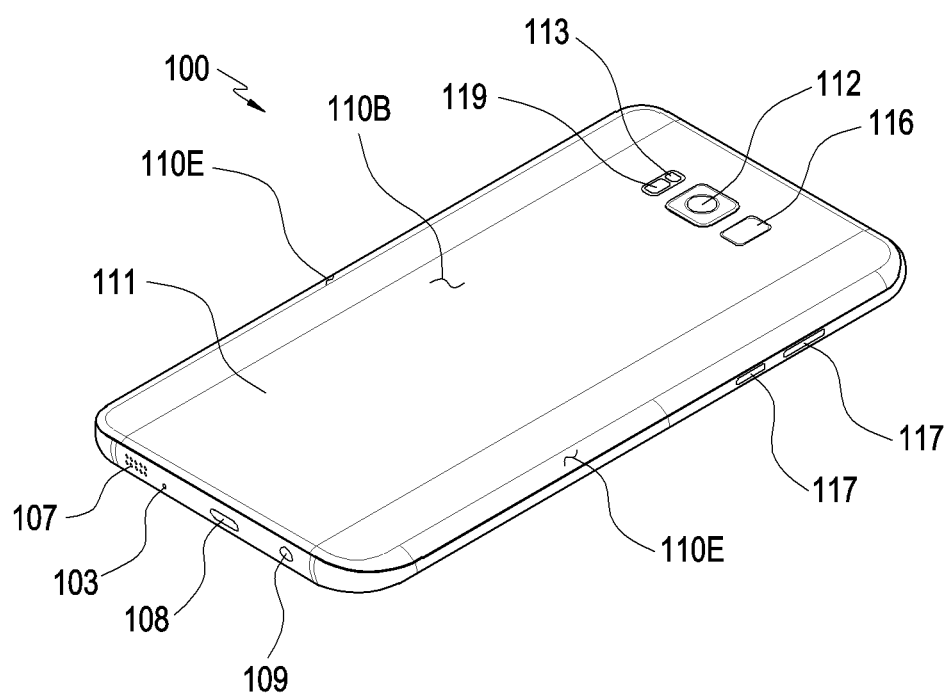
FIG. 2 is a perspective view illustrating the rear surface of the electronic device illustrated in FIG. 1.
Figure 3:
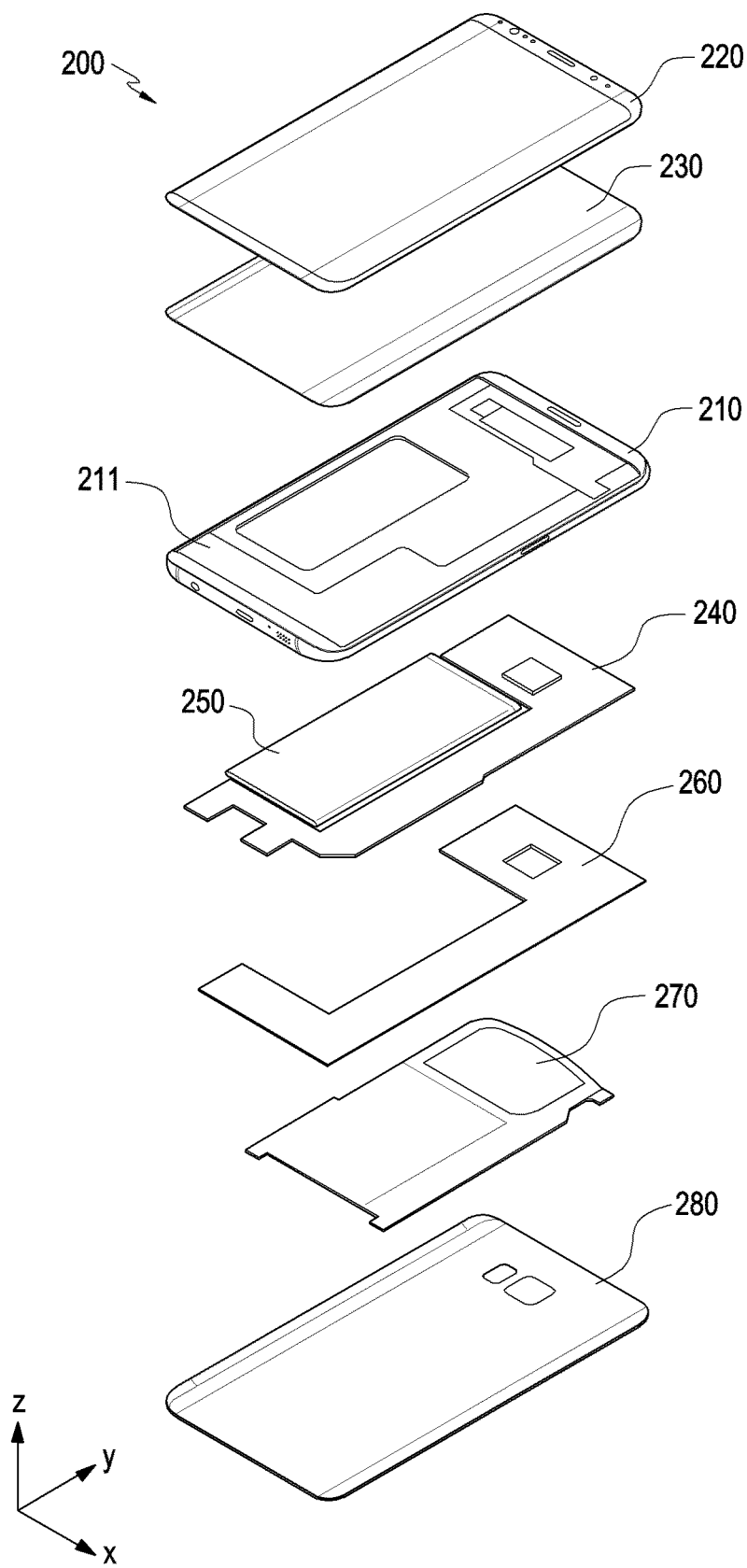
FIG. 3 is an exploded perspective view illustrating the electronic device illustrated in FIG. 1.

FIG. 1-3 describe a front, rear, and exploded view of an electronic device 101 which can contain printed circuit board (PCB) assemblies.

Housing of the Electronic Device

FIG. 1 is a perspective view illustrating the front surface of an electronic device 100 according to certain embodiments. FIG. 2 is a perspective view illustrating the rear surface of an electronic device 100 illustrated in FIG. 1.

Referring to FIGS. 1 and 2, the electronic device 100 according to an embodiment may include a housing 110 including a first surface (or front surface) 110A, a second surface (or rear surface) 110B, and a side surface 110c surrounding a space between the first surface 110A and the second surface 110B. In another embodiment (not shown), the housing may refer to a structure forming a part of the first surface 110A of FIG. 1, the second surface 110B of FIG. 2, and the side surface 110C. According to an embodiment, the first surface 110A may be formed by a front plate 102 (e.g., a glass plate or polymer plate including various coating layers) which is substantially transparent at least partially. In another embodiment, the front plate 102 may be coupled with the housing 110 to form an internal space together with the housing 110. The 'internal space' may refer to the space between the front plate 102 and a later-described first support member (e.g., a support member 211 of FIG. 3). In certain embodiments, the 'internal space' may refer to a space inside the housing 110, in which at least a part of a later-described display 101 or a display 230 of FIG. 3 is accommodated. Additionally, a plurality of PCBs can be disposed in the internal space. The PCBs can have mounted thereon, electronic components such as IC for performing various functions.

The second surface 110B may be formed by a substantially opaque rear plate 111. The rear plate 111 may be formed of, for example, coated or colored glass, ceramic, a polymer, a metal (e.g., aluminum, stainless steel (STS), or magnesium), or a combination of at least two of these materials. The side surface 110C may be coupled with the front plate 102 and the rear plate 111 and formed by a side bezel structure (or "side member") 118 including a metal and/or a polymer. In some embodiments, the rear plate 111 and the side bezel structure 118 may be integrally formed and contain the same material (e.g., a metal such as aluminum).

In the illustrated embodiment, the front plate 102 may include, at both ends of long edges thereof, two first areas 110D (e.g., curved areas) which are bent and extend seamlessly from the first surface 110A toward the rear plate 111. In the illustrated embodiment (see FIG. 2), the rear plate 111 may include, at both ends of long edges thereof, two second areas 110E (e.g., curved areas) which are bent and extend seamlessly from the second surface 110B toward the front plate 102. In certain embodiments, the front plate 102 (or the rear plate 111) may include only one of the first areas 110D (or the second areas 110E). In other embodiments, a part of the first areas 110D or the second areas 110E may not be included. In the above embodiments, when viewed from a side surface of the electronic device 100, the side bezel structure 118 may have a first thickness (or width) at side surfaces that do not include the first areas 110D or the second areas 110E (e.g., a side surface having a connector hole 108 formed thereon) and a second thickness smaller than the first thickness at side surfaces including the first areas 110D or the second areas 110E (e.g., side surfaces having key input device 117 arranged thereon).

According to an embodiment, the electronic device 100 may include at least one of the display 101, audio modules 103, 107, and 114, sensor modules 104, 116, and 119, camera modules 105, 112, and 113, the key input devices 117, light emitting elements 106, or connector holes 108 and 109. In certain embodiments, the electronic device 100 may not be provided with at least one (e.g., the key input devices 117 or the light emitting element 106) of the components or may additionally include other components. An electronic component mounted on a PCB may provide content provided to the display 101 and the audio modules 103, 107, and 114. Moreover, readings from the sensor modules 104, 116, and 119 may be provided to electronic components mounted onto PCBs. Additionally, the audio modules 103, 107, and 114 and sensor modules 104, 116, and 119 may be effectuated by transducers forming a portion of an electronic components mounted onto a PCB.

The display 101 may be exposed, for example, through a substantial part of the front plate 102. In certain embodiments, at least a part of the display 101 may be exposed through the front plate 102 forming the first surface 110A and the first areas 110D of the side surface 110C. In certain embodiments, the corners of the display 101 may be formed into the substantially same shapes as those of adjacent outer peripheral portions of the front plate 102. In other embodiments (not shown), to expand an area over which the display 101 is exposed, the distance between the outer periphery of the display 101 and the outer periphery of the front plate 102 may be substantially the same.

In other embodiments (not shown), a recess or opening may be formed in a part of a view area (e.g., active area) or an area (e.g., inactive area) outside the view area on the display 101, and at least one of the audio module 114, the sensor module 104, the camera module 105, or the light emitting elements 106 aligned with the recess or the opening may be included. In other embodiments (not shown), at least one of the audio module 114, the sensor module 104, the camera module 105, a fingerprint sensor 116, or the light emitting elements 106 may be included on the rear surface of the view area of the display 101. In other embodiments (not shown), the display 101 may be coupled with or disposed in vicinity of a touch sensing circuit, a pressure sensor for measuring the strength (pressure) of a touch, and/or a digitizer for detecting a magnetic field-type stylus pen. In some embodiments, at least some of the sensor modules 104 and 219 and/or at least some of the key input devices 117 may be disposed in the first areas 110D and/or the second areas 110E.

The audio modules 103, 107, and 114 may include a microphone hole 103 and speaker holes 107 and 114. In the microphone hole 103, a microphone for obtaining an external sound may be disposed, and in some embodiments, a plurality of microphones may be disposed to detect the direction of a sound. The speaker holes 107 and 114 may include an external speaker hole 107 and a receiver hole 114 for a call. In certain embodiments, the speaker holes 107 and 114 and the microphone hole 103 may be implemented as a single hole, or a speaker (e.g., a piezo speaker) may be included without the speaker holes 107 and 114.

The sensor modules 104, 116, and 119 may generate an electrical signal or a data value corresponding to an internal operating state of the electronic device 100 or an external environmental state. The sensor modules 104, 116, and 119 may include, for example, a first sensor module 104 (e.g., a proximity sensor) and/or a second sensor module (not shown) (e.g., a fingerprint sensor), and/or a third sensor module 119 (e.g., an HRM sensor) disposed on the second surface 110B of the housing 110 and/or a fourth sensor module 116 (e.g., a fingerprint sensor). The fingerprint sensor may be disposed on the second surface 110B as well as the first surface 110A (e.g., the display 101) of the housing 110. The electronic device 100 may further include at least one of sensor modules which are not shown, for example, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, and 113 may include a first camera device 105 disposed on the first surface 110A of the electronic device 100, and a second camera device 112 and/or a flash 113 disposed on the second surface 110B of the electronic device 100. Each of the camera devices 105 and 112 may include one or more lenses, an image sensor, and/or an image signal processor. The flash 113 may include, for example, a light emitting diode (LED) or a xenon lamp. In certain embodiments, two or more lenses (an IR camera and wide-angle and telephoto lenses) and image sensors may be disposed on one surface of the electronic device 100. Images captured by the camera modules 105, 112, and 113 may be stored in memory. Memory may be implemented as an IC mounted on a PCB.

The key input devices 117 may be disposed on the side surface 110C of the housing 110. In other embodiments, the electronic device 100 may not include some or any of the above-mentioned key input devices 117, and a key input device 117 which is not included may be implemented in a different form such as a soft key on the display 101. In certain embodiments, the key input devices may include the sensor module 116 disposed on the second surface 110B of the housing 110.

The light emitting elements 106 may be disposed, for example, on the first surface 110A of the housing 110. The light emitting elements 106 may provide, for example, state information about the electronic device 100 in the form of light. In other embodiments, the light emitting elements 106 may provide, for example, a light source operating in conjunction with the operation of the camera module 105. The light emitting elements 106 may include, for example, an LED, an IR LED, and a xenon lamp.

The connector holes 108 and 109 may include a first connector hole 108 for accommodating a connector (e.g., a USB connector) for transmitting and receiving power and/or data to and from an external electronic device, and/or a second connector hole (e.g., earphone jack) 109 for accommodating a connector for transmitting and receiving audio signals to and from an external electronic device.

FIG. 3 is an exploded perspective view illustrating an electronic device 200 illustrated in FIG. 1.

As noted above, the electronic device 100, 200 includes a number of electronic components, such as ICs. The electronic components can be disposed and interconnected on a plurality of PCBs.

Referring to FIG. 3, the electronic device 200 may include a side bezel structure 210, the first support member 211 (e.g., a bracket), a front plate 220, a display 230, and a printed circuit board 240, a battery 250, a second support member 260 (e.g., a rear case), an antenna 270, and a rear plate 280. In certain embodiments, at least one (e.g., the first support member 211 or the second support member 260) of the components may be omitted in or other components may be added to the electronic device 200. At least one of the components of the electronic device 200 may be identical or similar to at least one of the components of the electronic device 100 of FIG. 1 or FIG. 2, and a redundant description will be avoided below.

The first support member 211 may be disposed inside the electronic device 200 and coupled to the side bezel structure 210 or may be integrally formed with the side bezel structure 210. The first support member 211 may be formed of, for example, a metal and/or a non-metal (e.g., polymer). The first support member 211 may have one surface coupled with the display 230 and the other surface coupled with the printed circuit board 240. A processor, a memory, and/or an interface may be mounted on the printed circuit board 240. The processor may include, for example, at least one of a central processing unit (CPU), an application processor, a graphics processing unit, an image signal processor, a sensor hub processor, or a communication processor.

Substantially the entire area of the display 230 may be attached to the inner surface of the front plate 220, and an opaque layer may be formed in the vicinity of or around the area to which the display 230 is attached on the inner surface of the front plate 220. In an area of the front plate 220 in which the display 230 is not disposed, the opaque layer may block a part of an internal structure (e.g., the first support member 211) of the electronic device 200 from being exposed to the outside.

The memory may include, for example, a volatile memory or a non-volatile memory.

The interface may include, for example, a high definition multimedia interface (HDMI), a universal serial bus (USB) interface, an SD card interface, and/or an audio interface. The interface may, for example, electrically or physically coupled the electronic device 200 to an external electronic device, and may include a USB connector, an SD card/MMC connector, or an audio connector.

The battery 250 is a device for supplying power to at least one component of the electronic device 200, and may include, for example, a non-rechargeable primary battery, a rechargeable secondary battery, or a fuel cell. At least a part of the battery 250 may be disposed substantially on the same plane as the printed circuit board 240, for example. The battery 250 may be integrally disposed inside the electronic device 200 or may be disposed detachably from the electronic device 200.

The antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may, for example, perform short-range communication with an external device or wirelessly transmit/receive power required for charging. In other embodiments, an antenna structure may be formed by a part of the side bezel structure 210 and/or the first support member 211, or a combination thereof.

In certain embodiments to be described below, for example, some or all of the components of the electronic devices 100 and 200 of FIGS. 1 to 3 may be included. In the following detailed description, the same reference numerals as in the foregoing embodiment are assigned to or omitted for components that may be easily understood through the foregoing embodiment, and their detailed description may also be omitted.

As the complexity of the electronic device 100, 200 increases, a number of PCBs can be used. The PCBs can be connected by an interposer board. The interposer board can be bonded to the PCBs, thereby holding them together to maintain an electrical connection.

However, if electronic device 100, 200 is dropped by the user, a bonded part between an interposer board and another circuit board, PCB may be damaged. For example, a relative displacement may occur between two circuit boards bonded with an interposer board therebetween due to an impact or vibrations. This displacement may cause separation of the bonded part in the PCB assembly. Even though the displacement does not separate the bonded part between the interposer board and the other circuit boards, it may cause cracks in the interposer board or bonded structures (e.g., a via conductor or a soldering pad) disposed on the other circuit boards.

Accordingly, certain embodiments of the present disclosure, deformation of the PCB 240 can be prevented by a plurality of protruding structures on a surface of the first support member 211 to support arbitrary points of the printed circuit board assembly 240 as will be described in FIGS. 4-15.

Circuit Board Assembly

Figure 4:
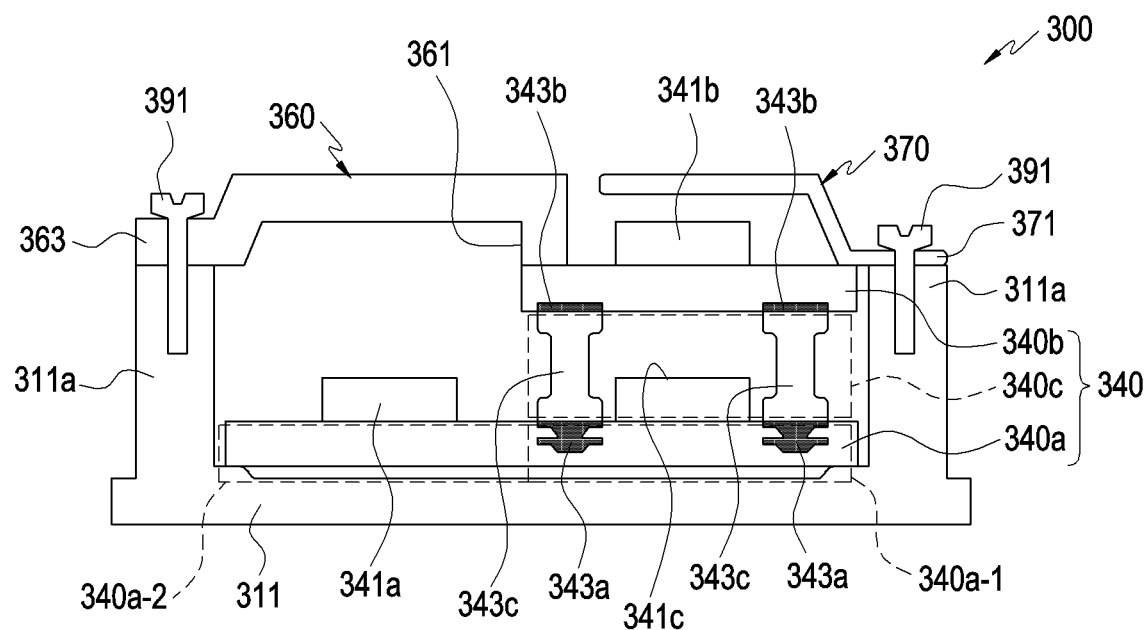
FIG. 4 is a sectional view illustrating a part of an electronic device according to certain embodiments of the disclosure.

FIG. 4 is a sectional view illustrating a part of an electronic device 300 (e.g., the electronic devices 100 and 200 of FIGS. 1 to 3) according to certain embodiments of the disclosure.

Circuit board 340*a* can have electronic component 341*a* and 341*c* mounted thereon. Circuit board 340*b* can have electronic component 341*b* mounted thereon. The circuit board 340*a* and circuit board 340*b* can be bonded together by interposer 340*c*. The circuit boards 340*a*, 340*b*, and interposer board 340*c* can be collectively referred to as PCB assembly 340. The PCB assembly 340 can be disposed between a first support member 311 and a cover member 370 and/or between the first support member 311 and the second support member 360

Referring to FIG. 4, the electronic device 300 may include a printed circuit board assembly 340 disposed between a first support member 311 and a cover member 370 and/or between the first support member 311 and the second support member 360. In an embodiment, the second support member 360 and/or the cover member 370 may bias the printed circuit board assembly 340 toward the first support member 311. For example, the printed circuit board assembly 340 may be fixed between the first support member 311 and the second support member 360 and/or between the first support member 311 and the cover member 370. The second support member 360 may provide downward structural force to circuit board 340*b* towards the first support member 311, thereby fixing the PCB assembly between the second support member 360 and the first support member.

The PCB assembly 340 may correspond to the PCB 240 of FIG. 3. The first support member 311 may correspond to the first support member 211 of FIG. 3. the second support member 360 may correspond to the second support member 260 of FIG. 3.

According to certain embodiments, the first support member 311 may be accommodated in a space between a front plate (e.g., the front plate 220 of FIG. 3) and a rear plate (e.g., the rear plate 280 of FIG. 3) of the electronic device 300, and formed of a metal material and/or a polymer material. In an embodiment, the first support member 311 may include a plurality of fastening bosses 311*a*. The fastening bosses 311*a* may provide means for mounting other structures. The second structures can include the second support member 360 or the cover member 370, for example. At least a part of the printed circuit board assembly 340, for example, a part of an edge of the printed circuit board assembly 340 may be supported by the first support member 311. While not shown, a plurality of protruding structures may be provided on a surface of the first support member 311 to support arbitrary points of the printed circuit board assembly 240 (e.g., a first circuit board 340*a*) The plurality of protruding structures prevent the printed circuit board assembly 340 from being deformed by an external force.

The cover member 370 may be coupled with the fastening boss 311*a* to face the first support member 311, with a part of the printed circuit board assembly 340 interposed therebetween. For example, the cover member 370 may include a plurality of first fastening pieces 371 extending from an edge thereof. In an embodiment, a part of an edge of the cover member 370 may be inclined toward the first support member 311, and the first fastening pieces 371 may extend from the inclined edge of the cover member 370. As the first fastening pieces 371 are fastened with some of the fastening bosses 311*a*, the cover member 370 may be coupled with the first support member 311 to face the first support member 311, with a part of the printed circuit board assembly 340 interposed therebetween. The first fastening pieces 371 may be formed at appropriate intervals along the edge of the cover member 370 to stably mount or fix the cover member 370 to the first support member 311.

In another embodiment, the cover member 370 may protect the printed circuit board assembly 340 from an external environment, and may be formed of a metal material such as stainless using steel (SUS) and used as an electromagnetic shielding structure. In another embodiment, the cover member 370 may function as a heat radiating member that disperses or radiates heat generated in one area (or space) of the electronic device 300 to other areas. In certain embodiments, the cover member 370 may act as a heat sink.

According to certain embodiments, the second support member 360 may be coupled with the first support member 311 to face the first support member 311, with another part of the printed circuit board assembly 340 interposed therebetween. For example, the second support member 360 may include a plurality of second fastening pieces 363 extending from an edge thereof, and the second fastening pieces 363 may be coupled with the other fastening bosses 311*a*. The second fastening pieces 363 may be formed at appropriate intervals along the edge of the second support member 360 to stably mount or fix the second support member 360 to the first support member 311. The second support member 360 may protect the printed circuit board assembly 240 from an external environment together with the cover member 370. In an embodiment, the second support member 360 may be formed of a metal material or a non-metal material. In another embodiment, the second support member 360 may include a conductor pattern formed on at least a part of a surface thereof, for example, a conductor pattern formed with a laser direct structure (LDS). The conductor pattern formed on the second support member 360 may be used as another antenna in the electronic device 300.

According to certain embodiments, the printed circuit board assembly 340 may include the first circuit board 340*a*, a second circuit board 340*b*, and/or an interposer board 340*c* interposed between the first circuit board 340*a* and the second circuit board 340*b*. The configuration of the printed circuit board assembly 340 will be described with further reference to FIGS. 5 and 6.

Figure 5:
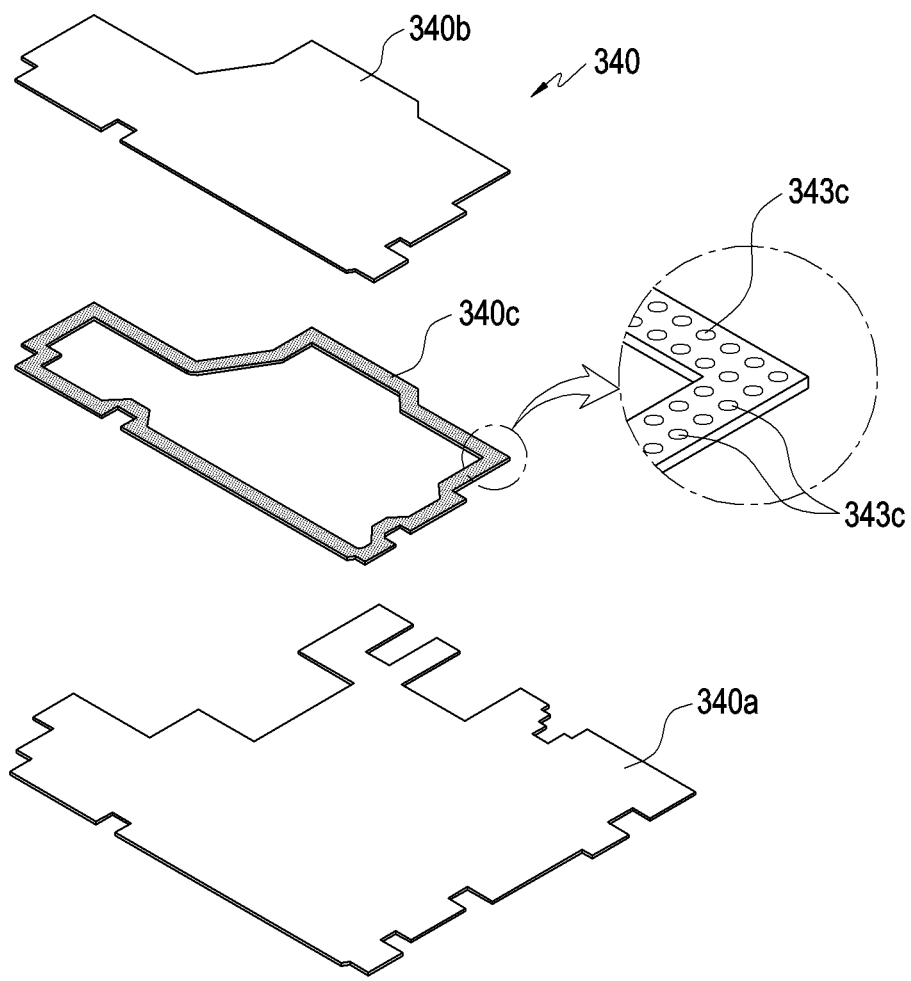
FIG. 5 is an exploded perspective view illustrating a printed circuit board assembly in an electronic device according to certain embodiments of the disclosure.
Figure 6:
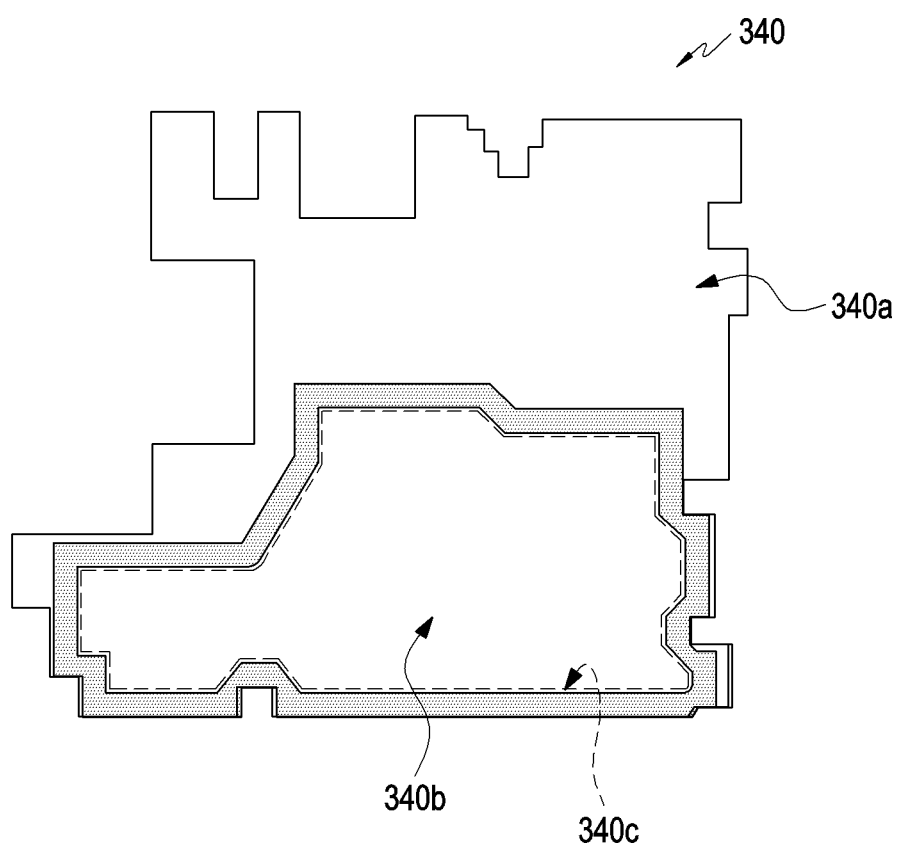
FIG. 6 is a plan view illustrating a printed circuit board assembly in an electronic device according to certain embodiments of the disclosure.

FIG. 5 is an exploded perspective view illustrating the printed circuit board assembly 340 in an electronic device (e.g., the electronic device 300 of FIG. 4) according to certain embodiments of the disclosure. FIG. 6 is a plan view illustrating the printed circuit board assembly 340 in an electronic device according to certain embodiments of the disclosure.

First circuit board 340*a* and second circuit board 340*b* can be bonded together by interposer board 340*c*. The interposer board 340*c* may include via conductors 343*c* bonded to soldering pads 343*a* and 343*b*. The soldering pads 343*a* and 343*b* may be disposed on one of the circuit boards 340*a* and 340*b*, respectively, and connected to each other through the via conductors 343c. In certain embodiments the first circuit board 340a can be a master circuit board and the second circuit board 340b can be a slave circuit board 340b.

With further reference made to FIGS. 5 and 6, the first circuit board 340a and the second circuit board 340b may be bonded to face each other through the interposer board 340c. In an embodiment, the second circuit board 340b may be formed in a size smaller than that of the first circuit board 340a, so that the second circuit board 340b faces a partial area (e.g., a first part 340a-1 of FIG. 4) of the first circuit board 340a. In another embodiment, the interposer board 340c may be disposed to correspond to at least a part of the periphery of the second circuit board 340b. For example, the interposer board 340c may be shaped into a frame corresponding to the shape of the second circuit board 340b. In some embodiments, as large a gap as the thickness of the interposer board 340c may be formed between the first circuit board 340a and the second circuit board 340b, and some of electrical or electronic components 341a, 341b, and 341c arranged on the printed circuit board assembly 340 may be disposed between the first circuit board 340a and the second circuit board 340b.

The first circuit board 340a may include the first part 340a-1 disposed between the cover member 370 and the first support member 311, and a second part 340a-2 disposed between the second support member 360 and the first support member 311. In an embodiment, an edge of one surface of the first circuit board 340a may be fixed while being supported by the first support member 311. In some embodiments, the protruding structures (not shown) provided on the first support member 311 may support arbitrary points of the first circuit board 340a. For example, the first support member 311 may maintain the first circuit board 340a in the shape of a flat plate. In an embodiment, the first circuit board 340a may include first electrical or electronic components 341a and 341c disposed on at least one surface thereof. For example, an integrated circuit chip such as a processor, an active element such as a transistor or an amplifier, a passive element such as a resistor or a capacitor, or an electromagnetic shielding member may be disposed on the first circuit board 340a. At least some of the first electrical or electronic components 341a and 341c may be disposed in an area disposed between the cover member 370 and the first support member 311, for example, in the first part 340a-1.

According to certain embodiments, the second circuit board 340b may be disposed between the first circuit board 340b and the cover member 370, facing a part of the first circuit board 340a, for example, the first part 340a-1. According to an embodiment, the second circuit board 340b may include at least one second electrical or electronic component 341b disposed on at least one surface thereof. The cover member 370 may protect the second electrical or electronic component 341b from an external environment, and may provide an electromagnetic shielding environment to the second electrical or electronic component 341b.

According to certain embodiments, the interposer board 340c may include a plurality of via conductors 343c. The via conductors 343c may penetrate through the interposer board 340c, so that both end surfaces of the via conductors 343c are exposed from both surfaces of the interposer board 340b. The first circuit board 340a may include first soldering pads 343a corresponding to the via conductors 343c, and the second circuit board 340b may include second soldering pads 343b corresponding to the via conductors 343c. For example, as each of the via conductors 343c is bonded to one of the first soldering pads 343a and one of the second soldering pads 343b, respectively, the via conductors 343c may couple the first circuit board 340a with the second circuit board 340b. The via conductors 343c may be bonded to the first soldering pads 343a or the second soldering pads 343b by means of solder balls or solder paste.

According to an embodiment, the first soldering pads 343a or the second soldering pads 343b may be printed conductors formed on a surface of the first circuit board 340a or a surface of the second circuit board 340b, and may be partially embedded in the first circuit board 340a or the second circuit board 340b. When the first soldering pads 343a or the second soldering pads 343b are embedded, the first circuit board 340a and the interposer board 340c or the second circuit board 340b and the interposer board 340c may be more firmly coupled or fixed to each other. In an embodiment, some of the first soldering pads 343a or the second soldering pads 343b may be electrically coupled to printed wires of the first circuit board 340a or the second circuit board 340b. For example, some of the via conductors 343c may be electrically coupled to printed wires of the first circuit board 340a or the second circuit board 340b through some of the first soldering pads 343a or the second soldering pads 343b, and thus used as lines for transmitting electrical signals between the first circuit board 340a and the second circuit board 340b.

Referring again to FIG. 4, the second support member 360 and/or the cover member 370 may at least partially bias the second circuit board 340b toward the first circuit board 340a or the first support member 311. The second support member 360 and/or cover member 370 may bias the second circuit board 340b by providing structural force pressing the second circuit board 340b towards the first support member 311. The foregoing prevents separation of the interposer 340c, the first circuit board 340a and the second circuit board 340b from occurring during an external impact.

In an embodiment, the second support member 360 may include a biasing portion 361 extending or deformed to be bent from a part of an edge of the second support member 360 toward the first circuit board 340a or the first support member 311. When the second support member 360 is mounted to the first support member 311, the biasing portion 361 may contact a part of the second circuit board 340b and bias the printed circuit board assembly 340 (e.g., the second circuit board 340b). In another embodiment, being mounted on the first support member 311, the cover member 370 may at least partially contact another part of the second circuit board 340b and bias the printed circuit board assembly 340 (e.g., the second circuit board 340b). For example, the printed circuit board assembly 340 may be fixed between the first support member 311 and the second support member 360 or between the first support member 311 and the cover member 370. In some embodiments, the part of the second circuit board 340b which contacts the biasing portion 361 or the cover member 370 may correspond to a part of the interposer board 340c. For example, the biasing portion 361 or the cover member 370 may bring the first circuit board 340a (e.g., the first soldering pads 343a), the interposer board 340c (e.g., the via conductors 343c) and/or the second circuit board 340b (e.g., the second soldering pads 343b) into close contact with each other.

According to certain embodiments, as the first support member 311 in contact with the first circuit board 340a, and the second support member 360 or the cover member 370 in contact with the second circuit board 340b bias the second circuit board, the printed circuit board assembly 340 may be fixed between the first support member 311 and the second support member 360 and/or between the first support member 311 and the cover member 370. For example, a part of the printed circuit board assembly 340 corresponding to the second part 340a-2 of the first circuit board 340a may be fixed between the first support member 311 and the second support member 360. In another embodiment, the first portion 340a-1 of the first circuit board 340a and/or the second circuit board 340b may be fixed between the first support member 311 and the cover member 370. In an embodiment, the printed circuit board assembly 340 may be biased by the first support member 311 and the second support member 360 and/or the first support member 311 and the cover member 370. For example, the first circuit board 340a, the second circuit board 340b, and/or the interposer board 340c may be maintained in a firmly coupled state, and may not move or vibrate with respect to each other, even when an external impact occurs.

An area biased by the second support member 360 (e.g., the biasing portion 361) or the cover member 370 will be described with further reference to FIGS. 7 and 8. In an embodiment described with reference to FIGS. 7 and 8, terms signifying parts of a component, such as "edge" or "center" may be used. These terms signifying parts of a component are based on the structures illustrated in FIGS. 7 and 8, and those skilled in the art will easily understand the parts of the component indicated by the terms from the following detailed description.

Figure 7:
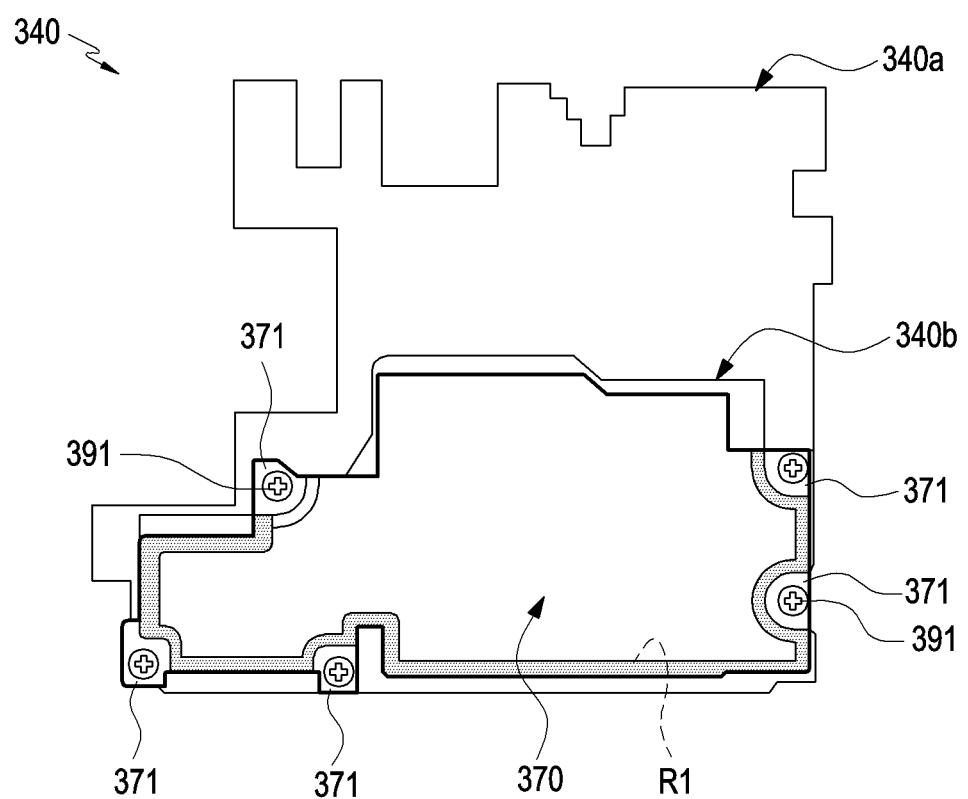
FIG. 7 is a plan view illustrating a printed circuit board assembly coupled with a cover member in an electronic device according to certain embodiments of the disclosure.

FIG. 7 is a plan view illustrating the printed circuit board assembly 340 coupled with the cover member 370 in an electronic device (e.g., the electronic device 300 of FIG. 4) according to certain embodiments of the disclosure. FIG. 8 is a plan view illustrating the printed circuit board assembly 340 coupled with the second support member 360 in an electronic device according to certain embodiments of the disclosure.

Figure 8:
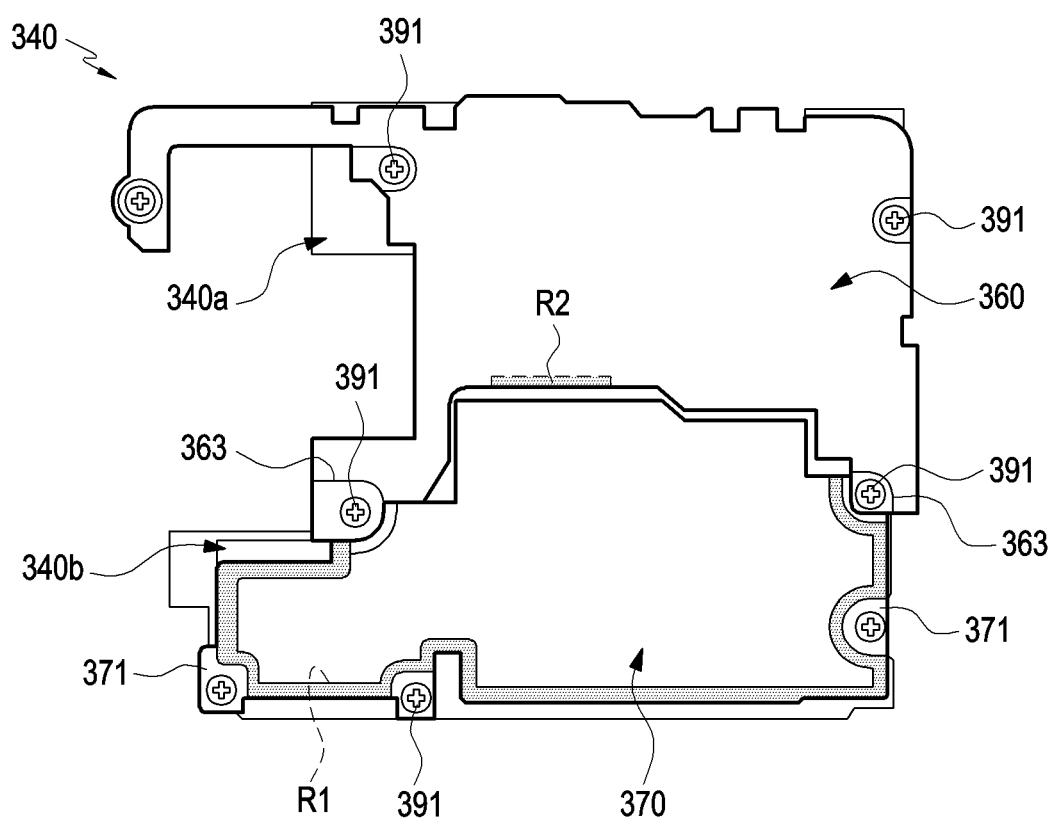
FIG. 8 is a plan view illustrating a printed circuit board assembly coupled with a second support member in an electronic device according to certain embodiments of the disclosure.

With further reference made to FIGS. 7 and 8, a first area R1 of the second circuit board 340b, which the cover member 370 contacts or biases, may be located substantially at an edge of the printed circuit board assembly 340. For example, the cover member 370 may bias the second circuit board 340b around or between points (e.g., the first fastening pieces 371) at which the cover member 370 is fastened with the first support member 311. In an embodiment, the cover member 370 may be more stably fixed or the second circuit board 340b may be biased by an appropriate force, by designing the first fastening pieces 371 or fastening members 391 to be spaced from each other at smaller intervals.

A hole (not shown) is formed at the center of the printed circuit board assembly 340 to penetrate through the first circuit board 340a, and provide a space in which one of the fastening members 391 may be disposed (e.g., a passage for fastening the printed circuit board assembly 340 to the first support member 311). However, an area available for arrangement of the first electrical or electronic components 341a and 341c or an area available for formation of printed conductive lines may be limited by as much as the through hole formed in the first circuit board 340a. For example, designing or disposing an area (e.g., the first area R1) at an edge of the second circuit board 340b, which the cover member 370 contacts or biases, in the vicinity of the edge of the second circuit board 340b prevents reduction of the area available for arrangement of the first electrical or electronic components 341a and 341c or reduction of the area available for formation of printed conductive lines.

According to certain embodiments, the second support member 360 (e.g., the biasing portion 361) may contact or bias the edge of the second circuit board 340b, at the center of the printed circuit board assembly 340, for example, at the boundary between the first part 340a-1 and the second part 340a-2 of the first circuit board 340a. For example, a second area R2 of the second circuit board 340b, which the biasing portion 361 contacts or biases, may be located substantially at the center of the printed circuit board assembly 340. While the second area R2 is shown in FIG. 8 as a an area narrower compared to the first area R1, the foregoing is only shown by way of example, and not limitation. For example, the extension or inclination angle of the biasing portion 361 may be designed in various manners, and the biasing portion 361 may contact the second circuit board 340b over a wider area at the center of the printed circuit board assembly 360.

The first support member 311 or the second support member 360 may be a structure making the electronic device 300 more rigid. For example, even though the second fastening pieces 363 are not densely arranged, the second support member 360 may sufficiently bias the second circuit board 340b through the biasing portion 361. For example, even though an additional through hole is not formed at the center of the printed circuit board assembly 340, the second support member 360 having sufficient rigidity may bias the second circuit board 340b with an appropriate force at the center of the printed circuit board assembly 340. In another embodiment, since there may be no need to form an additional through hole at the center of the printed circuit board assembly 340, an area for arranging electric or electronic components or forming printed conductive wires may not be limited. As described later with reference to FIG. 12, the cover member 370 may further include an extension piece (e.g., an extension piece 779 of FIG. 12) located at the center of the printed circuit board assembly 340, and the extension piece (e.g., the extension piece 779 of FIG. 12) of the cover member 370 may be disposed between the biasing portion 361 and the second circuit board 340b in the second area R2. For example, a part (e.g., the extension piece 779 of FIG. 12) of the cover member 370 (e.g., the extension piece 779 of FIG. 12) together with the second support member 360 may bias a part of an edge of the second circuit board 340b (e.g., the second area R2).

Figure 9:
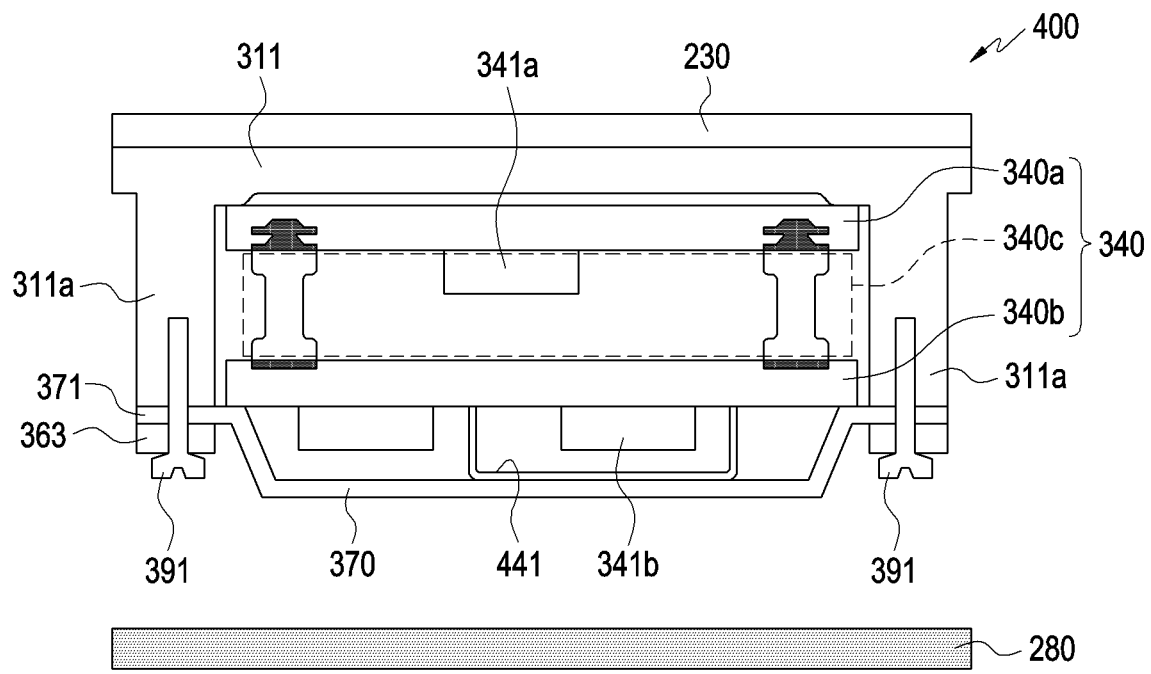
FIGS. 9 and 10 are sectional views illustrating various arrangement structures in an electronic device according to certain embodiments of the disclosure.

According to certain embodiments, along the periphery of the second support member 360 from the second area R2, each of two second fastening pieces 363 closest to the second area R2 may be disposed to overlap with one of the first fastening pieces 371 (see FIG. 9). For example, the biasing portion 361 may bias the second circuit board 340b between the second fastening pieces 363 overlapping with the first fastening pieces 371. In another embodiment, one of the fastening members 391 may penetrate through a first fastening piece 371 and a second fastening piece 363 which are disposed to overlap with each other, to be fastened with the first supporting member 311. In some embodiments, because the second support member 360 may have greater rigidity than the cover member 370, when the first fastening pieces 371 and the second fastening pieces 363 are disposed to overlap with each other, the first fastening pieces 371 may be disposed between the first supporting member 311 (e.g., a fastening boss 311a) and the second supporting member 360 (e.g., the second fastening piece 363).

As such, the cover member 370 biases the second circuit board 340b at the edge of the printed circuit board assembly 340, and the second support member 360 biases the second circuit board 340b at the center (e.g., the second area R2) of the printed circuit board assembly 340. Therefore, the bonding structure using the interposer board 340c may be stably maintained. In an embodiment, when an external impact is applied, the second support member 360 and the cover member 370 may suppress generation of a relative displacement between the first circuit board 340a and the interposer board 340c or between the second circuit board 340b and the interposer board 340c. For example, despite application of an impact, the second support member 360 and the cover member 370 may prevent damage to the printed circuit board assembly 340.

Circuit Board Assembly Disposed in Electronic Device

Figure 10:
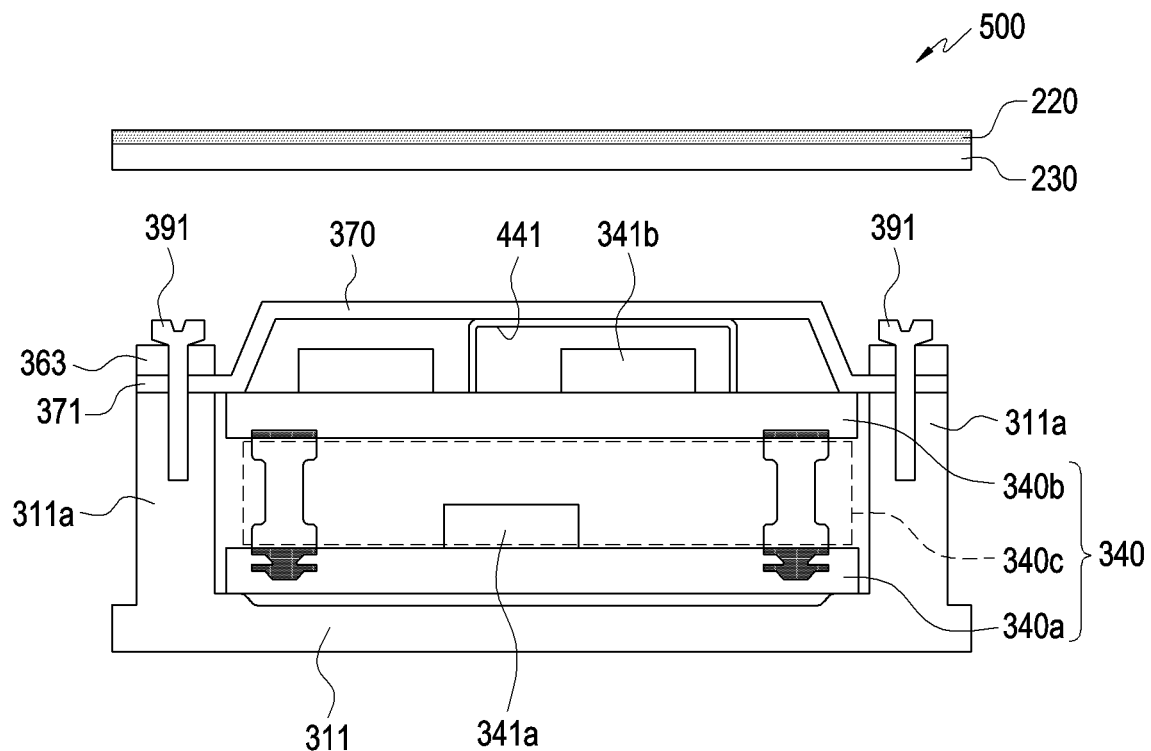

FIGS. 9 and 10 are sectional views illustrating various arrangement structures of an electronic device (e.g., the electronic devices 100, 200, and 300 of FIGS. 1 to 4) according to certain embodiments of the disclosure. From the side, the top part of the electronic device 100, 200, 300 can be the display 230, while the bottom part can be the rear plate. The first support member 311 can be affixed to the back of the display 230 as shown in FIG. 9. The display 230 can be connected to the rear plate 280 by a side wall of the housing. Thus, the cover member 370 can be suspended above the rear plate 280 and separated by a gap. In FIG. 10, the first support member 311 can be laterally supported by a sidewall of the housing of the electronic device, and have a space between the cover member 370 and the back of the display 230.

Referring to FIG. 9, the printed circuit board assembly 340 may be disposed in a space between the rear plate 280 (e.g., the rear plate 280 of FIG. 3) and the first support member 311 of an electronic device 400. For example, when the display 230 (e.g., the display 230 of FIG. 3) of the electronic device 400 is located on one surface of the first support member 311, the printed circuit board assembly 340 may be located on the other surface of the first support member 311. According to an embodiment, a first shielding member 441 may be provided as an electric or electronic component disposed on the second circuit board 340b. The first shielding member 441 may be disposed to surround at least one other electric or electronic component 341b and provide an electromagnetic shielding structure. In another embodiment, some (e.g., the first shielding member 441) of electrical or electronic components on the second circuit board 340b may be disposed in contact with the cover member 370. For example, as the first shielding member 441 is disposed in contact with the cover member 370, the first shielding member 441 may generate a force for biasing the second circuit board, and the first shielding member 441 and/or the cover member 370 may bring the second circuit board 340b into close contact with the interposer board 340c.

Referring to FIG. 10, the printed circuit board assembly 340 may be disposed in a space between the front plate 220 (or the display 230) and the first support member 311 of an electronic device 500. When the printed circuit board assembly 340 is disposed between the display 230 and the first support member 311, the cover member 370 or a second support member (e.g., the second support member 360 of FIG. 4) may prevent other structures (e.g., the first shielding member 441) from interfering with the display 230, while supporting the display 230. In another embodiment, a protection member (e.g., a SUS plate) may be provided under the display 230 and contact the second support member 360 or the cover member 370.

FIGS. 11 to 15 are diagrams illustrating modification examples of an electronic device (e.g., the electronic devices 100, 200, and 300 of FIGS. 1 to 4) according to certain embodiments of the disclosure.

Figure 11:
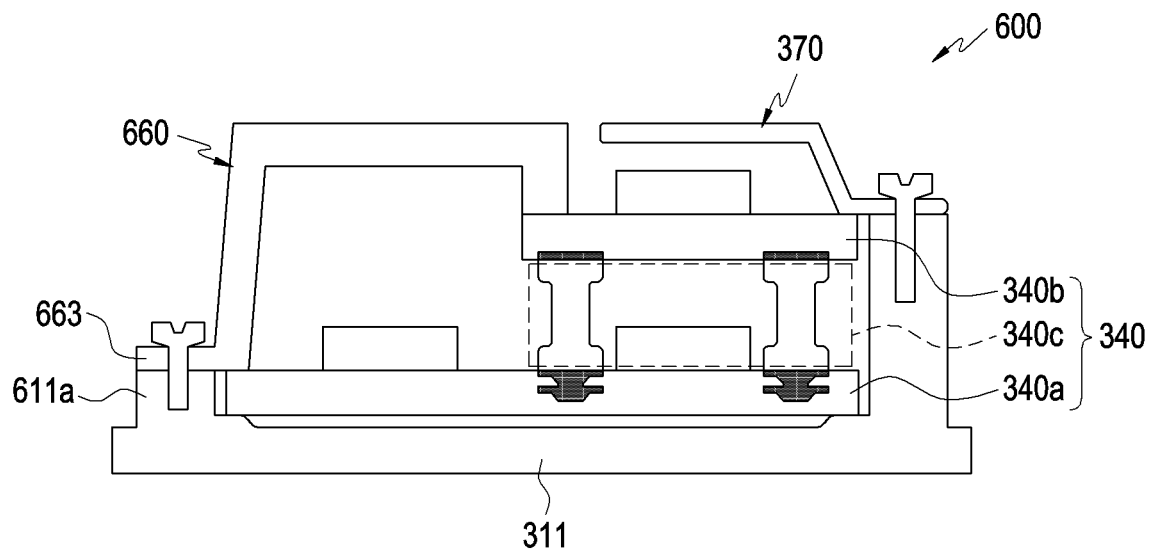
FIGS. 11 to 15 are diagrams illustrating modification examples of an electronic device according to certain embodiments of the disclosure.
Figure 12:
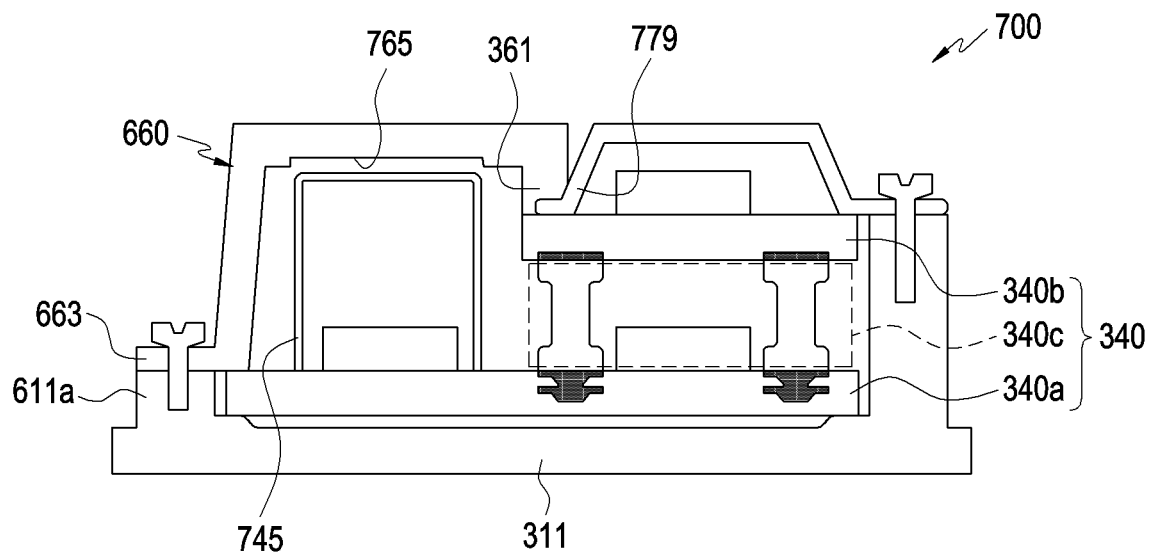

In FIGS. 11 and 12, the fastening bosses 611a can be substantially lower, and second support member 660 can include a may have a vertical portion that extends towards the first support member 311.

In an electronic device 600 of FIG. 11, a part (e.g., a second fastening piece 663) of a second support member 660 (e.g., the second support member 360 of FIG. 4) may bias the first circuit board 340a. For example, some (e.g., a fastening boss denoted by reference number '611a') of the fastening bosses of the first support member 311 may be formed to a height at which the first circuit board 340a is disposed, and a part (e.g., the second fastening piece 663) of the second support member 360 may extend to the fastening boss 611a. According to an embodiment, a part of an edge of the first circuit board 340a may be fixed between the first support member 311 and the second fastening piece 663. For example, the second support member 660 may bias the second circuit board 340b at the center (e.g., the second area R2) of the printed circuit board assembly 340 and bias the part of the edge of the first circuit board 340a in a second part (e.g., the second part 340a-2 of FIG. 4).

In an electronic device 700 of FIG. 12, a second shielding member 745 may be provided as an electric or electronic component disposed on the first circuit board 340a. The second shielding member 745 may be disposed to surround at least one other electric or electronic component 341a and provide an electromagnetic shielding structure. In an embodiment, the shielding member 745 can be used to shield an electronic component from a transmission signal by an antenna. In an embodiment, an electric or electronic component (e.g., the second shielding member 745) on the first circuit board 340a may be disposed apart from the second support member 660. For example, transfer of the biasing force of the second support member 660 to a part other than the edge of the first circuit board 340a may be prevented, and the biasing portion 361 may stably contact (or bias) the second circuit board 340b. In another embodiment, when the second shielding member 745 is formed to a significant height, the second support member 660 may include an avoiding groove 765 formed on an inner surface thereof, thereby being spaced from the second shielding member 660. In another embodiment, a cover member 770 may further include an extension piece 779 located at the center (e.g., the second area R2) of the printed circuit board assembly 340. The extension piece 779 may extend inclined toward the first support member 311, and an end of the extension piece 779 may be disposed between the biasing portion 361 of the second support member 660 and the second circuit boards 340b. For example, a part of the cover member 770, for example, the end of the extension piece 779 together with the second support member 660 may bias a part of an edge of the second circuit board 340b.

Figure 13:
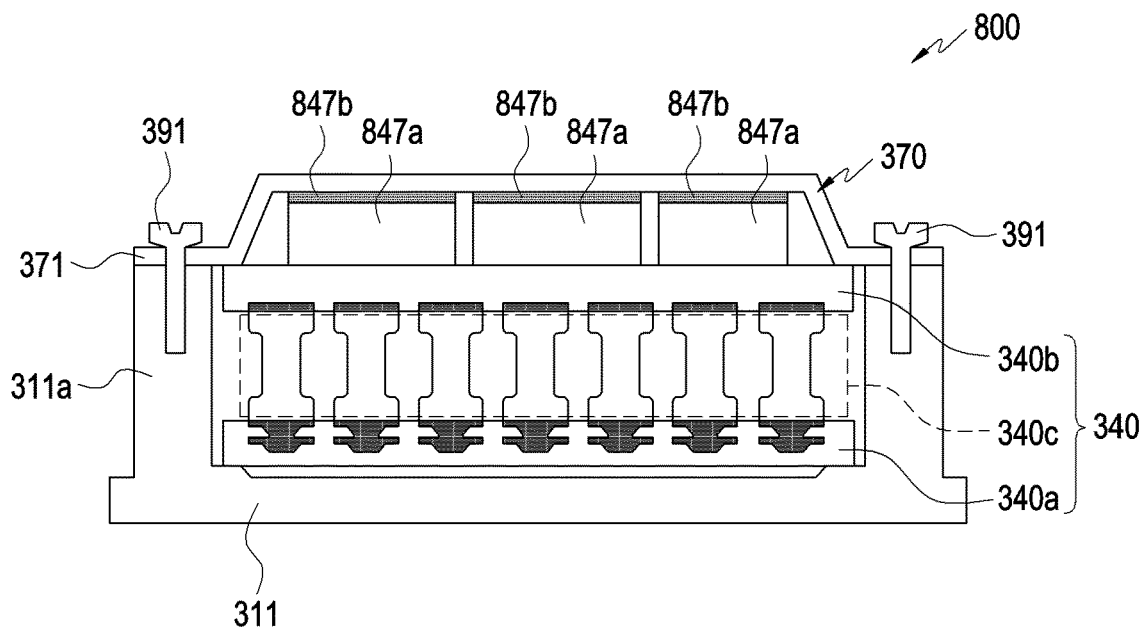
Figure 14:
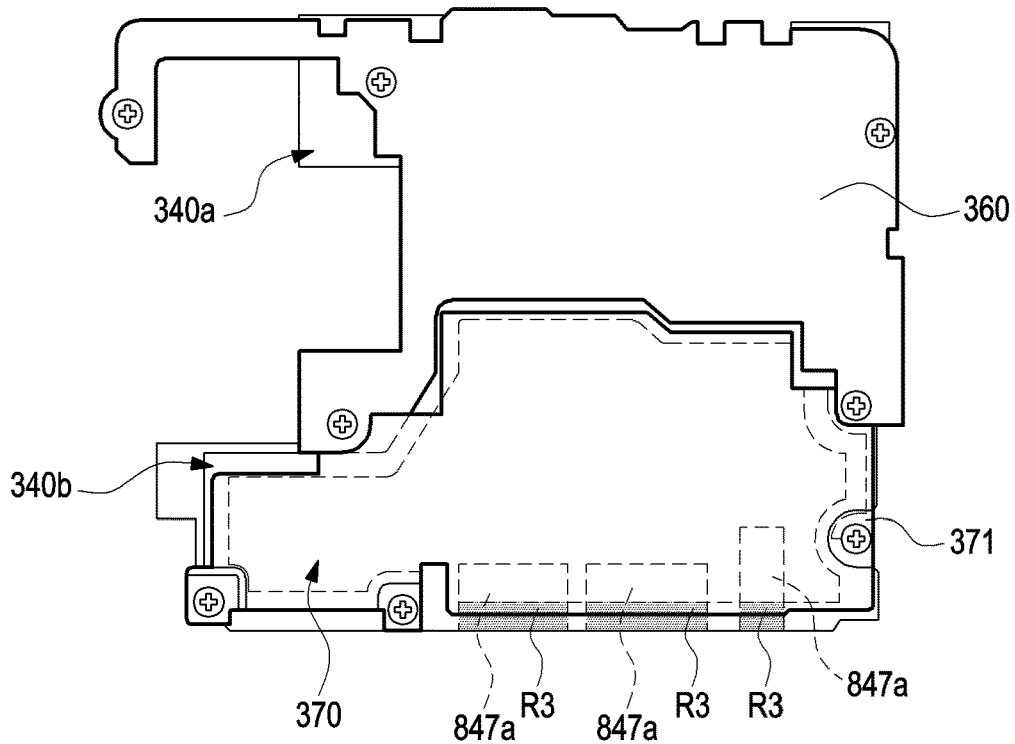

In an electronic device 800 of FIGS. 13 and 14, electric or electronic components disposed on the second circuit board 340b may include connection member(s) 847a. In an embodiment, the connection member(s) 847a may provide a means for coupling an electronic component such as a display, a camera, a speaker, a vibration module, or a microphone to the second circuit board 340b. In another embodiment, the connection member(s) 847a may provide a means for coupling an external device such as a USB connector, an earphone jack, an HDMI connector, or a storage medium socket to the electronic device 800. In an embodiment, when providing a means for coupling an external device to the electronic device 800, the connecting member(s) 847a may be disposed on a part of an edge of the second circuit board 340b. For example, in the second circuit board 340b, the connection member(s) 847a may be disposed to overlap with at least a part of an area corresponding to the interposer board 340c. The area in which the connection member(s) 847a overlaps with the interposer board 340c is denoted by reference numeral 'R3', which will be referred to as a 'third area'. In some embodiments, the third area R3 may partially overlap with a first area (e.g., the first area R1 of FIG. 8). According to an embodiment, when the connection member(s) 847a is disposed to overlap with the area corresponding to the interposer board 340c, the cover member 370 may be disposed in contact with the connection member(s) 847a. In another embodiment, the cover member 370 may be in contact with the connection member(s) 847a between two adjacent fastening pieces 371. For example, the cover member 370 may maintain or support the connection member(s) 847a fixed to the second circuit board 340b. In another embodiment, a metal stiffener 847b may be provided between the cover member 370 and the connection member(s) 847a. In this case, the cover member 370 may not come into contact with the connection member(s) 847a. The stiffener 847b may include an insulation material (e.g., an insulating coating layer) to provide an insulation structure between the cover member 370 and the connection member(s) 847a. In some embodiments, when the connection member(s) 847a is disposed to overlap with the area corresponding to the interposer board 340c, the connection member(s) 847a may transfer the biasing force of the cover member 370 to the second circuit board 340b.

In certain embodiments, a biasing member 991 can be disposed between either the front or rear plate 220, 230 of the electronic device and the second support member 660, and cover member.

Figure 15:
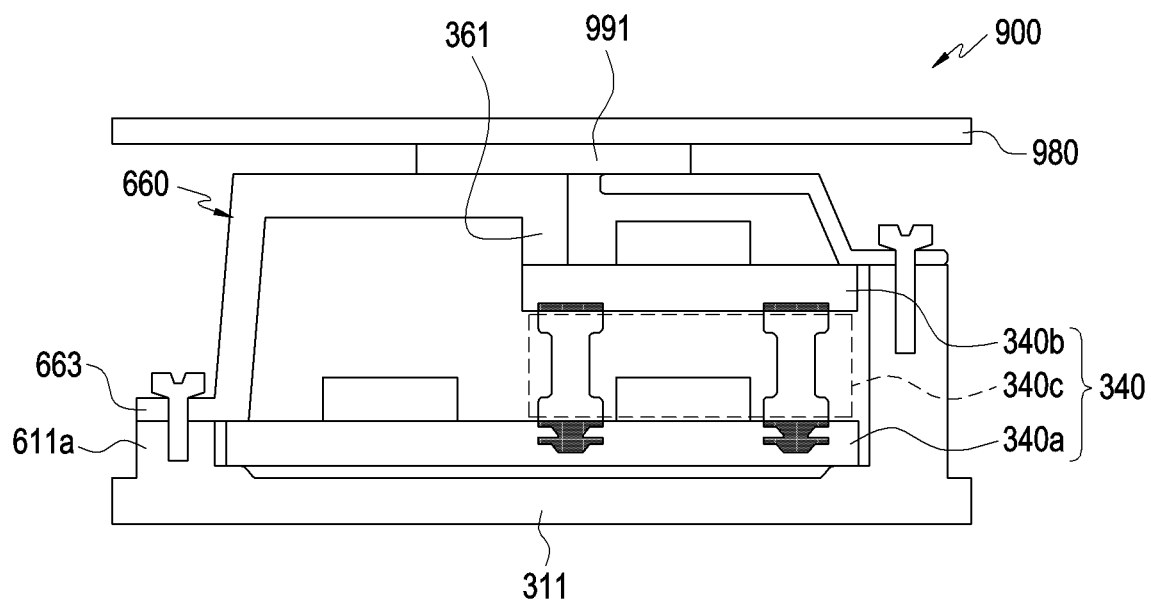

Referring to FIG. 15, an electronic device 900 may further include a biasing member 991 that biases the second support member 660 or the cover member 370. The biasing member 991 may include an elastic material such as silicone, urethane, or sponge, and may be the whole or part of the antenna 370 of FIG. 3. In some embodiments, the biasing member 991 may be disposed inside a plate 980 (e.g., the front plate 220, the display 230, or the rear plate 280 of FIG. 3) of a housing. For example, the biasing member 991 may be disposed between the plate 980 and the second support member 660 or between the plate 980 and the cover member 370. According to an embodiment, when the plate 980 is assembled, the biasing member 991 may be compressed to a certain extent and accumulate an elastic force. The elastic force accumulated in the biasing member 991 may bias the second support member 660 or the cover member 370. In another embodiment, the biasing member 991 may be disposed in an area in which the biasing member 991 overlaps with the biasing portion 361 of the second supporting member 660. For example, the biasing member 991 may bias the second circuit board 340b by using the biasing portion 361.

As described above, according to certain embodiments of the disclosure, a printed circuit board assembly in which a plurality of circuit boards (e.g., the first circuit board 340a and the second circuit board 340b of FIG. 4) are bonded to face each other may be stably fixed between a second support member or a cover member (e.g., the second support member 360 and the cover member 370 of FIG. 4) and the first support member. In an embodiment, as the second support member or the cover member biases a second circuit board in an area corresponding to an interposer board (e.g., the interposer board 340c of FIG. 4), both ends of each of via conductors (e.g., the via conductors 343c of FIG. 4) of the interposer board may be firmly maintained to be coupled with a first circuit board or the second circuit board. For example, despite application of an external impact, damage to the bonding structure of the printed circuit board assembly may be prevented.

According to certain embodiments of the disclosure, an electronic device (e.g., the electronic devices 100, 200, and 300 of FIGS. 1 to 4) may include a housing (e.g., the housing 110 of FIG. 1) including a first support member (e.g., the first support member 211 or 311 of FIG. 3 or FIG. 4), a cover member (e.g., the cover member 370 of FIG. 4 of FIG. 8) coupled with and facing the first support member, a second support member (e.g., the second support member 360 of FIG. 4 or FIG. 8) coupled with and facing the first support member, a printed circuit board assembly (e.g., the a printed circuit board assembly 240 of FIG. 3 or the a printed circuit board assembly 340 of FIGS. 4 to 8) facing the first support member, with a part of printed circuit board assembly, and another part between the first support member and the second support member. The printed circuit board assembly may include a first circuit board (e.g., the first circuit board 340a of FIGS. 4 to 8) including a first part (the first part 340a-1 of FIG. 4) disposed between the first support member and the cover member and a second part (the second part 340a-2 of FIG. 4) disposed between the first support member and the second support member and the first support member, a second circuit board (e.g., the second circuit board 340b of FIGS. 4 to 6) disposed to at least partially face the first part and disposed between the first circuit board and the cover member, and an interposer board (e.g., the interposer board 340c of FIGS. 4 to 6) disposed to correspond to at least a part of an edge of the second circuit board and coupling the second circuit board with the first circuit board, and the second support member biasing a part (e.g., the second area R2 of FIG. 8) of the edge of the second circuit board.

According to certain embodiments, the second support member may bias the second circuit board in an area overlapping a part of the interposer board.

According to certain embodiments, the cover member may bias another part (e.g., the first area R1 of FIG. 7 or FIG. 8) of the edge of the second circuit board at an edge of the printed circuit board assembly.

According to certain embodiments, the cover member may bias the second circuit board in an area overlapping another part of the interposer board.

According to certain embodiments, the electronic device may further include a plurality of first fastening pieces (e.g., the first fastening pieces 371 of FIG. 4 or FIG. 8) extending from an edge of the cover member, a plurality of second fastening pieces (e.g., the second fastening pieces 363 of FIG. 4 or FIG. 8) extending from the edge of the second support member, and a plurality of fastening members (e.g., the fastening members 391 of FIG. 4 or FIG. 8). At least one of the first fastening pieces may be disposed to overlap with one of the second fastening pieces, and one of the fastening members may penetrate through the first fastening piece and the second fastening piece which are disposed to overlap with each other and may be fastened with the first support member.

According to certain embodiments, the second support member may further include a biasing portion (e.g., the biasing portion 361) bent toward the first support member. Each of at least a pair of second fastening pieces may overlap with one of the first fastening pieces, and the biasing portion may bias the second circuit board between the second fastening pieces overlapping with the first fastening pieces.

According to certain embodiments, the electronic device may further include a first electrical or electronic component (e.g., the first electrical or electronic components 341a and 341c of FIG. 4) mounted on the first circuit board in the second part, and the second support member may be spaced apart from the first electrical or electronic component.

According to certain embodiments, the electronic device may further include a second electrical or electronic component (e.g., the second electrical or electronic component 341b of FIG. 4) mounted on the second circuit board, and the cover member may be disposed to contact the second electrical or electronic component.

According to certain embodiments, the cover member may further include an extension piece (e.g., the extension piece 779 of FIG. 12) extending toward the first support member and located at a center of the printed circuit board assembly, and an end of the extension piece may be interposed between the second circuit board and the second support member and bias a part of the edge of the second circuit board, together with the second support member.

According to certain embodiments, the housing may further include a front plate (e.g., the front plate 220 of FIG. 3 or FIG. 10) disposed to face forward and a rear plate (e.g., the rear plate 280 of FIG. 3 or FIG. 9) disposed to face an opposite direction of the front plate, and the first support member may be accommodated in a space between the front plate and the rear plate.

According to certain embodiments, the electronic device may further include a display (e.g., the display 230 of FIG. 3 or FIG. 10) attached to an inner surface of the front plate, and the printed circuit board assembly may be disposed in a space between the display and the first support member.

According to certain embodiments, the printed circuit board assembly may be disposed in a space between the front plate and the first support member or a space between the rear plate and the first support member.

According to certain embodiments, the electronic device may further include a biasing member (e.g., the biasing member 991 of FIG. 15) disposed inside the front plate or the rear plate, and the biasing member may bias the second support member or the cover member. According to certain embodiments, the second support member may bias a part of an edge of the first circuit board in the second part.

According to certain embodiments, the electronic device further comprises a plurality of first fastening pieces extending from an edge of the cover member; a plurality of second fastening pieces extending from the edge of the second support member; and a plurality of fastening members, wherein at least one of the first fastening pieces overlaps with one of the second fastening pieces, and wherein one of the fastening members penetrates through the first fastening piece and the second fastening piece that overlap with each other and is fastened with the first support member.

According to certain embodiments, a second support member comprises a biasing portion at an edge, wherein the biasing portions is bent toward the first support member, wherein each of at least a pair of second fastening pieces overlaps with one of the first fastening pieces, and wherein the biasing portion is configured to bias the second circuit board between the second fastening pieces overlapping with the first fastening pieces.

According to certain embodiments, an electronic device further comprises comprising a plurality of electrical or electronic components arranged on the second circuit board, wherein the cover member contacts at least one of the electrical or electronic components.

According to certain embodiments, the at least one electrical or electronic component contacting the cover member is disposed to overlap with at least a part of an area corresponding to the interposer board.

According to certain embodiments, an electronic device comprises: a housing including a first support member; a first circuit board facing the first support member; a second circuit board facing the first support member, with a first part of the first circuit board therebetween; an interposer board corresponding to at least a part of an edge of the second circuit board and coupling the second circuit board with the first circuit board; a cover member coupled with the first support member to face the first support member, with the first part of the first circuit board or the second circuit board therebetween; and a second support member coupled with and facing the first support member, with a second part of the first circuit board therebetween, wherein the cover member biases a part of an edge of the second circuit board toward the first circuit board, and wherein the second support member is biases the first circuit board toward the first support member in the second part, and biases another part of the edge of the second circuit board toward the first circuit board.

According to certain embodiments, the electronic device may further include a plurality of first fastening pieces extending from an edge of the cover member, a plurality of second fastening pieces extending from the edge of the second support member, and a plurality of fastening members. At least one of the first fastening pieces may be disposed to overlap with one of the second fastening pieces, and one of the fastening members may penetrate through the first fastening piece and the second fastening piece which are disposed to overlap with each other and may be fastened with the first support member.

According to certain embodiments, the electronic device may further include a biasing portion being a part of the edge of the second support member deformed to be bent toward the first support member, each of at least a pair of second fastening pieces may overlap with one of the first fastening pieces, and the biasing portion may bias the second circuit board between the second fastening pieces overlapping with the first fastening pieces.

According to certain embodiments, the part of the second circuit board biased by the cover member or the second support member may overlap with at least a part of an area corresponding to the interposer board.

According to certain embodiments, the electronic device may further include a plurality of electrical or electronic components arranged on the second circuit board, and the cover member may contact at least one of the electrical or electronic components.

According to certain embodiments, the at least one electrical or electronic component contacting the cover member may be disposed to overlap with at least a part of an area corresponding to the interposer board.

According to certain embodiments, the cover member comprises a heat conductor and is configured to radiate heat generated by the electronic device.

While specific embodiments have been described in the detailed description of the disclosure, it will be obvious to those skilled in the art that many modifications can be made without departing from the scope of the disclosure.

The invention claimed is:

1. An electronic device comprising:
   a printed circuit board assembly including a first circuit board, a second circuit board disposed over the first circuit board and smaller than the first circuit board, and an interposer board coupling the first circuit board with the second circuit board, wherein at least a portion of the interposer board is disposed along a portion of an edge of the second circuit board;

a first electrical or electronic component mounted on the first circuit board in a portion of the first circuit board on which the second circuit board is not disposed;
a first support member on which the printed circuit board assembly disposed; and
a second support member which covers the portion of the first circuit board forming a space between the portion of the first circuit board and the second support member and including a first portion connected to the first support member and a second portion which press a first portion of the portion of the edge of the second circuit board, and
wherein the second support member is spaced apart from the first electrical or electronic component.

2. The electronic device of claim 1, wherein the second support member is configured to press the first portion of the portion of the edge of the second circuit board in an area overlapping a portion of the interposer board.

3. The electronic device of claim 1, further comprising:
a cover member coupled with the first support member,
wherein the cover member is configured to press a second portion of the portion of the edge of the second circuit board at an edge of the printed circuit board assembly.

4. The electronic device of claim 3, wherein the cover member is configured to press the second portion of the portion of the edge of the second circuit board in an area overlapping another portion of the interposer board.

5. The electronic device of claim 1, further comprising:
a cover member coupled with the first support member,
wherein the cover member further includes an extension piece extending toward the first support member and located at a center of the printed circuit board assembly, and
wherein an end of the extension piece is interposed between the second circuit board and the second support member and with the second support member presses the first portion of the portion of the edge of the second circuit board.

6. The electronic device of claim 1, further comprising:
a display attached to an inner surface of a front plate;
the front plate facing forward; and
a rear plate disposed facing an opposite direction of the front plate, and
wherein the first support member is disposed in a space between the front plate and the rear plate, and the printed circuit board assembly is disposed in a space between the display and the first support member.

7. The electronic device of claim 1, further comprising:
a front plate disposed to face forward; and
a rear plate disposed to face an opposite direction of the front plate, and
wherein the first support member is disposed in a space between the front plate and the rear plate, and the printed circuit board assembly is disposed in a space between the front plate and the first support member or a space between the rear plate and the first support member.

8. The electronic device of claim 1, wherein the second support member is configured to press a portion of an edge of the first circuit board in the portion of the first circuit board on which the second circuit board is not disposed.

9. The electronic device of claim 1, further comprising:
a cover member coupled with the first support member;
a plurality of first fastening pieces extending from an edge of the cover member;
a plurality of second fastening pieces extending from the edge of the second support member; and
a plurality of fastening members,
wherein at least one of the plurality of first fastening pieces overlaps with one of the plurality of second fastening pieces, and
wherein one of the plurality of fastening members penetrates through the at least one of the plurality of first fastening pieces and the one of the plurality of second fastening pieces that overlap with each other and is fastened with the first support member.

10. The electronic device of claim 9, wherein the second support member comprises a pressing portion at an edge, wherein the pressing portion is bent toward the first support member,
wherein each of at least a pair of second fastening pieces overlaps with one of the plurality of first fastening pieces, and
wherein the pressing portion is configured to press the first portion of the portion of the edge of the second circuit board between the second fastening pieces overlapping with the plurality of first fastening pieces.

11. The electronic device of claim 1, further comprising:
a cover member coupled with the first support member; and
a plurality of electrical or electronic components arranged on the second circuit board,
wherein the cover member contacts at least one of the plurality of electrical or electronic components.

12. The electronic device of claim 11, wherein the at least one of the plurality of electrical or electronic components contacting the cover member is disposed to overlap with at least a portion of an area corresponding to the interposer board.

13. An electronic device comprising:
a housing including a first support member;
a first circuit board disposed on the first support member;
a second circuit board disposed on the first support member, with a first portion of the first circuit board therebetween;
a first electrical or electronic component mounted on the first circuit board in a second portion of the first circuit board on which the second circuit board is not disposed;
an interposer board corresponding to at least a portion of an edge of the second circuit board and coupling the second circuit board with the first portion of the first circuit board;
a cover member coupled with the first support member, with the first portion of the first circuit board or the second circuit board therebetween; and
a second support member coupled with the first support member, with the second portion of the first circuit board therebetween and spaced apart from the first electrical or electronic component,
wherein the cover member is configured to press a first portion of the at least portion of the edge of the second circuit board toward the first circuit board, and
wherein the second support member is configured to press the first circuit board toward the first support member in the second portion, and is configured to press a second portion of the at least portion of the edge of the second circuit board toward the first circuit board.

14. The electronic device of claim 13, further comprising:
a plurality of first fastening pieces extending from an edge of the cover member;
a plurality of second fastening pieces extending from the edge of the second support member; and
a plurality of fastening members, wherein at least one of the plurality of first fastening pieces is overlaps with one of the plurality of second fastening pieces, and wherein one of the plurality of fastening members penetrates through the at least one of the plurality of first fastening pieces and the one of the plurality of second fastening pieces that overlap with each other and is fastened with the first support member.

15. The electronic device of claim 14, further wherein the second support member comprises a pressing portion at an edge of the second support member bent toward the first support member, wherein each of at least a pair of second fastening pieces overlaps with one of the plurality of first fastening pieces, and wherein the pressing portion is configured to press the second circuit board between the second fastening pieces overlapping with the plurality of first fastening pieces.

16. The electronic device of claim 13, wherein the portion of the second circuit board pressed by the cover member or the second support member overlaps with at least a portion of an area corresponding to the interposer board.

17. The electronic device of claim 13, further comprising a plurality of electrical or electronic components arranged on the second circuit board, wherein the cover member contacts at least one of the plurality of electrical or electronic components.

18. The electronic device of claim 17, wherein the at least one of the plurality of electrical or electronic component contacting the cover member overlaps with at least a portion of an area corresponding to the interposer board.

19. The electronic device of claim 13, wherein the cover member comprises a heat conductor and is configured to radiate heat generated by the electronic device.

* * * * *